United States Patent [19]

Shimada et al.

[11] Patent Number: 5,235,269
[45] Date of Patent: Aug. 10, 1993

[54] WAVEFORM MEASURING DEVICE

[75] Inventors: Shusaku Shimada; Hiroshi Kawarabayashi, both of Tokyo, Japan

[73] Assignee: Yokogawa Electric Corporation, Tokyo, Japan

[21] Appl. No.: 884,760

[22] Filed: May 18, 1992

Related U.S. Application Data

[62] Division of Ser. No. 495,244, Mar. 19, 1990, Pat. No. 5,153,501.

[51] Int. Cl.⁵ .................. G01R 13/20; G01R 19/165
[52] U.S. Cl. ............................. 324/121 R; 364/487
[58] Field of Search ........... 324/103 P, 103 R, 121 R, 324/77 R; 364/487; 340/660–4

[56] References Cited

U.S. PATENT DOCUMENTS

| | | | |
|---|---|---|---|
| 3,748,576 | 7/1973 | Sigournay . | |
| 3,906,362 | 9/1975 | Morris et al. | 324/121 R |
| 4,064,488 | 12/1977 | Chapman | 364/487 |
| 4,271,391 | 6/1981 | Kmetz | 324/103 P |
| 4,350,953 | 9/1982 | Best et al. | 324/121 R |
| 4,399,512 | 8/1983 | Soma et al. | 324/121 R |
| 4,527,117 | 7/1985 | Morgan et al. | 324/121 R |
| 4,651,091 | 3/1987 | Chambers et al. . | |
| 4,766,173 | 8/1988 | Chambers et al. . | |
| 4,779,028 | 10/1988 | Blair | 364/487 |
| 4,823,076 | 4/1989 | Haines | 324/121 R |
| 4,827,259 | 5/1989 | Murphy | 364/487 |
| 4,906,916 | 3/1990 | Koslar | 324/121 R |
| 4,926,120 | 5/1990 | Veronesi et al. . | |
| 4,937,037 | 6/1990 | Griffiths et al. | 324/121 R |
| 4,972,138 | 11/1990 | Bush | 324/121 R |
| 5,025,208 | 6/1991 | Danzeisen | 324/77 R |
| 5,041,856 | 8/1991 | Veronesi et al. . | |

FOREIGN PATENT DOCUMENTS

| | | | |
|---|---|---|---|
| 3700368 | 6/1988 | Fed. Rep. of Germany | 324/121 R |
| 0135366 | 8/1982 | Japan | 324/121 R |
| 63298166 | 5/1988 | Japan . | |
| 1348881 | 3/1974 | United Kingdom . | |
| 2101330A | 1/1983 | United Kingdom . | |

*Primary Examiner*—Ernest F. Karlsen
*Attorney, Agent, or Firm*—Moonray Kojima

[57] ABSTRACT

A waveform measuring device comprising an A/D converter for converting an input signal into a digital signal, a memory storing output data from the A/D converter, a first trigger condition detecting unit for detecting a present input signal meeting a first trigger condition, a second trigger condition detecting unit for detecting a past input signal of a desired time which is remote from the present time and meeting a second trigger condition, and a trigger signal generating unit for generating a trigger signal when the trigger conditions of the first and second trigger condition detecting units are satisfied. The waveform of the input signal corresponding to a desired interval is displayed in accordance with the trigger signal from the trigger signal generating unit. The input signal to the second trigger condition detecting unit is given without reading it out of the memory.

4 Claims, 19 Drawing Sheets

Fig. 4(a) Clock CLK1
Fig. 4(b) Output Data
Fig. 4(c) Clock CLK2
Fig. 4(d) Selector Output
Fig. 4(e) Clock CLK4
Fig. 4(f) Clock CLK3
Fig. 4(g) Counter Output
Fig. 4(h) Flip-flop 22 Output
Fig. 4(i) Analog Comparator Output TG Fig.11 (a) CLK1
Fig.11 (b) CLKa
Fig.11 (c) CLKb
Fig.11 (d) CLKc
Fig.11 (e) CLKd

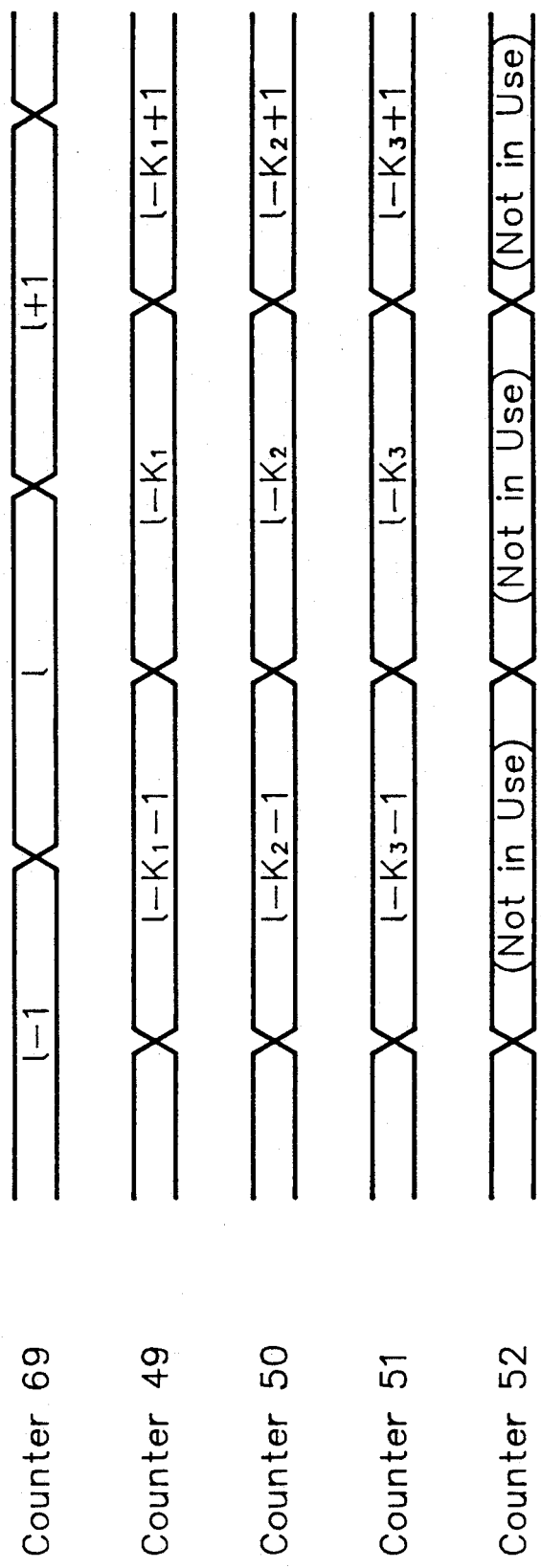

WAVEFORM MEASURING DEVICE

This is a division, of application Ser. No. 495,244, filed Mar. 19, 1990, now U.S. Pat. No. 5,153,501.

BACKGROUND OF THE INVENTION

1. Field of Invention

This invention relates to a waveform measuring device for making the waveform of an input signal observable; and more particularly, to an improvement of a trigger signal generating circuit that makes waveform observation easy.

2. Description of Prior Art

One type of waveform measuring device is called a digital oscilloscope which stores an input signal in a memory after converting the input signal into a digital signal, and displays a waveform on a display unit, such as a cathode ray tube (CRT), on the basis of the digital data held in the memory.

FIG. 1 is a block diagram showing an example of such a conventional waveform measuring device. In FIG. 1, an input signal is applied to an Analog-to-Digital (A/D) converter 1, which converts the input signal into a digital signal in synchronization with a pulse signal applied from a clock pulse generator 8, the digital signal then being stored in a memory 2. The input signal is also applied to a trigger circuit 4. When the input signal reaches a given level which is preset, trigger circuit 4 applies a signal to a trigger control circuit 5. Trigger control circuit 5 applies a control signal to memory 2 and to a display control circuit 6 on the basis of the output from trigger circuit 4. Display control circuit 6 applies a control signal to memory 2 and to a sweep generating circuit 7 on the basis of an output signal from trigger control circuit 5 and a clock pulse signal from clock pulse generator 8. The data held in memory 2 is applied through a Digital-to-Analog (D/A) converter, not shown, to the Y-axis of CRT 3, whereas the output signal from sweep generating circuit 7 is applied to the X-axis, whereby a waveform is displayed on CRT 3. During waveform displaying, to make the observation easier, the moment when the input signal reaches a given preset level is made to accord always with the left end of a display area of CRT 3. An unblanking circuit 9 is provided for inhibiting unnecessary displaying.

The operation of the conventional waveform measuring device will now be described in connection with its use to display an input signal whose waveform varies irregularly, as shown in FIG. 2(A). The dotted line in FIG. 2(A) represents a trigger level TL. When the input signal crosses the trigger level TL in the low-to-high direction of level, i.e. at moments $t_1$, $t_2$, $t_3$, a trigger signal is generated. As a result, display of the waveform on a CRT 3 takes place in a manner such that the points of these moments $t_1$, $t_2$, $t_3$ always accord with the left end of the CRT.

However, since individual portions of the waveform of FIG. 2(A) subsequent to moments $t_1$, $t_2$, $t_3$ differ from one another, these portions are displayed in superposed form as shown in FIG. 2(B), thereby making waveform observation impossible.

To overcome the defects of such a conventional device, one of the present inventors has invented an improved digital oscilloscope which is disclosed in Japanese Patent Laid-Open No. 63/298,166. This digital oscilloscope is such that an input signal is converted into a digital signal by an A/D converter and then stored in a memory. Past data which occurred at a certain time backward from the present moment in time is read out from the memory. Only when the present input signal crosses the trigger level while the past data is within a preset range, is a trigger signal generated and a waveform displayed. By such a device, it is possible to display a specified portion alone of a complicated irregular waveform, thereby making waveform observation easy and reliable.

However, disadvantageously, the past data must be read out of the memory and compared with the preset range for the purpose of generating the trigger signal. Thus, not all of the data can be utilized which correspond to past moments remote from the present moment. Only data requiring the shortest time necessary to write data in the memory and to read data out of the memory can be utilized.

Conceptually a system could be conceived which operates in such a manner that among the data held in a memory, a plurality of data blocks having a desired temporal relationship therebetween are read out, and each data block is compared with a preset level by software processing to generate a signal identical to the trigger signal. Such a system, unfortunately would need a long time for software processing. Thus, such a system could not be utilized for reat-time measurement.

SUMMARY OF THE INVENTION

An object of the invention is to provide a waveform measuring device which utilizes past data to cause triggering so as to display a specified portion of an irregular waveform and to do so virtually in real time.

Another object is to provided a waveform measuring device which utilizes past data of moments in time closer to or more remote from the present moment in in time to cause triggering without increasing the scale of the circuit.

A further object is to provide a waveform measuring device which utilizes a plurality of data components of past moments close to or remote from the present moment to cause triggering.

DETAILED DESCRIPTION OF THE PREFERRED EMBODIMENTS

Figure 1:
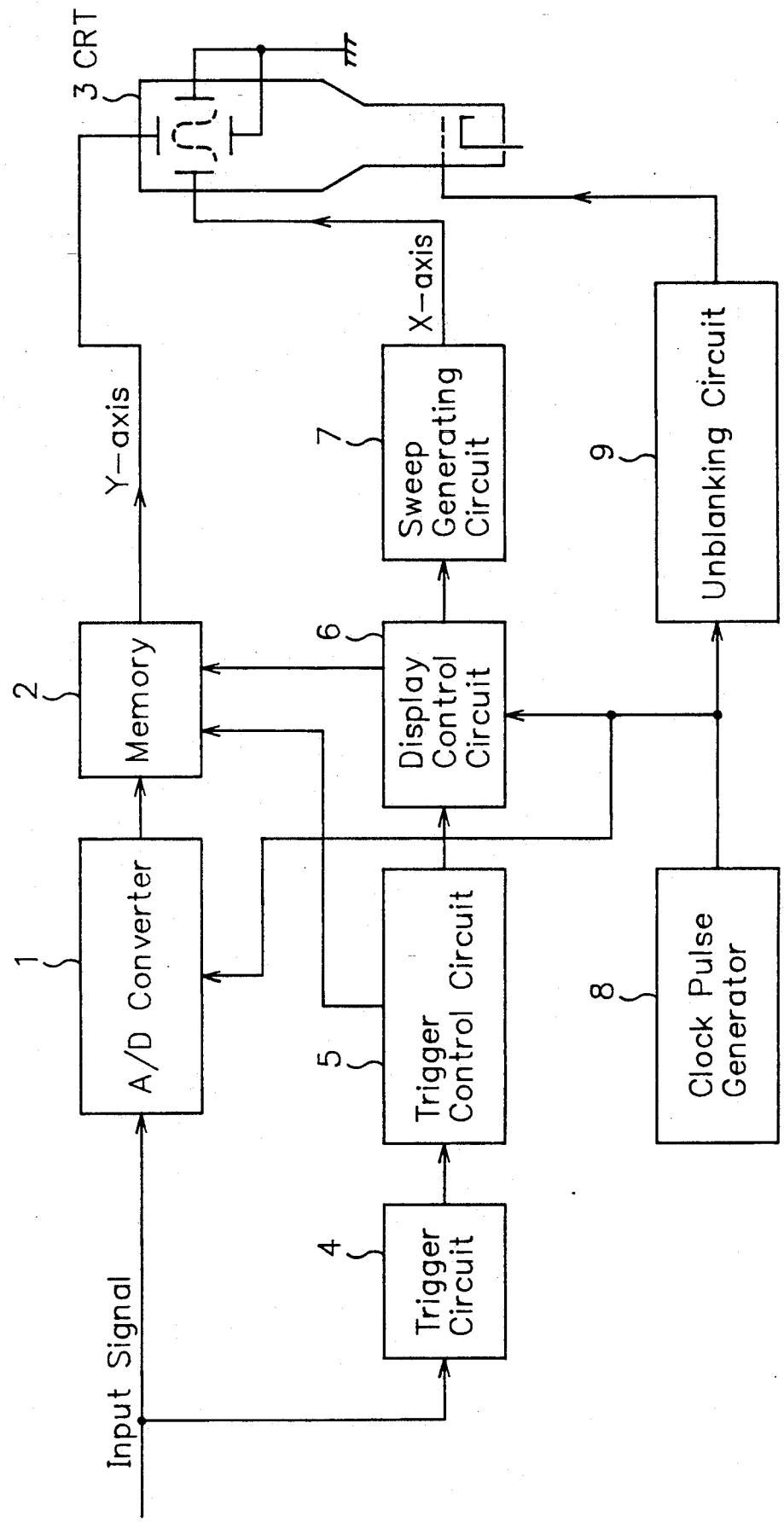
FIG. 1 is a block diagram depicting a conventional waveform measuring device.
Figure 2:
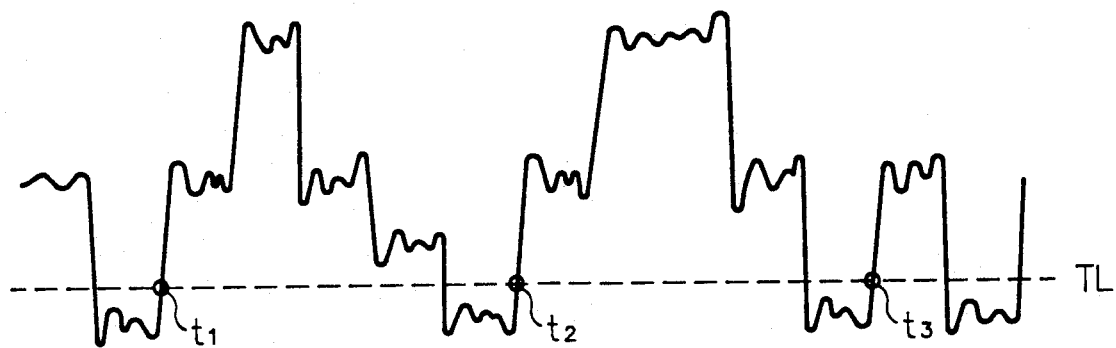
FIG. 2(A) and FIG. 2(B) are waveform diagrams for explaining the display operation of the device of FIG. 1.
Figure 2:
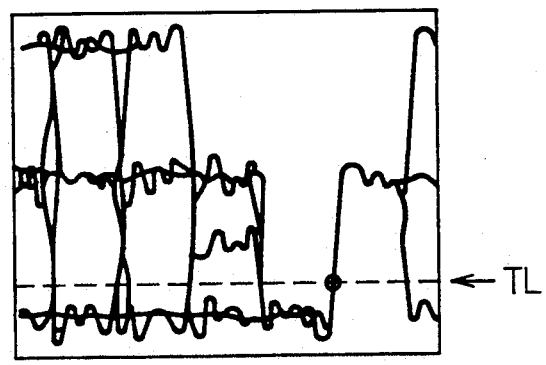
Figure 3:
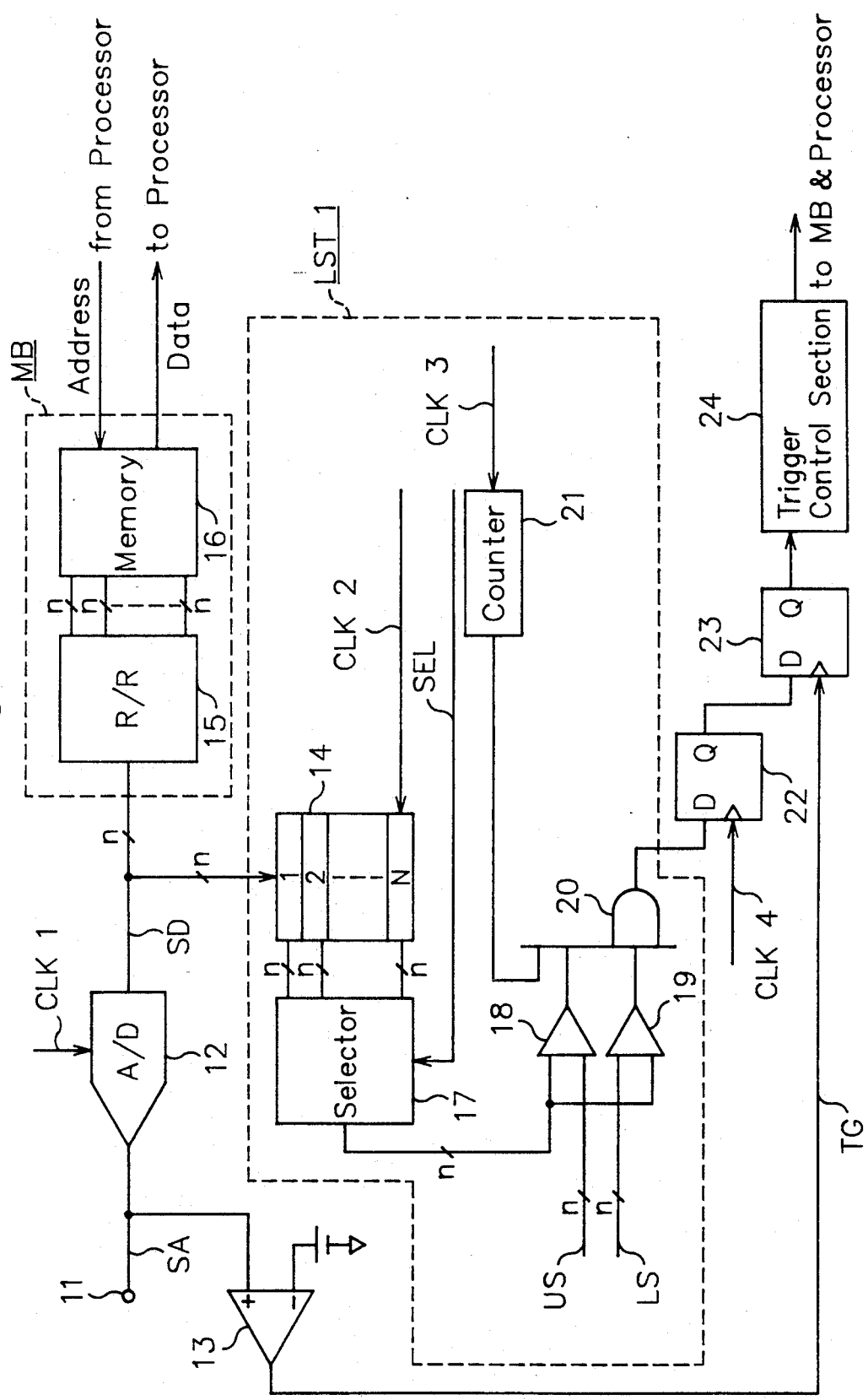
FIG. 3 is a block diagram depicting an illustrative embodiment of the invention.

Turning now to FIG. 3, an input terminal 11, to which an input signal SA is applied, is connected to the input terminal of A/D converter 12 and to one input terminal of analog comparator 13, acting as a first trigger condition detecting means. A/D converter 12 performs a sampling operation on the input signal SA applied to input terminal 11, in accordance with a clock CLK1 and corrects the input signal into a digital signal SD of n bits. Output data SD of A/D converter 12 is successively stored in a shift register 14 of N stages, each having n bits, in accordance with a clock CLK2 synchronized with clock CLK1, and on the other hand after being distributed by a rate reducer 15 to m routes, is stored in memory 16. Rate reducer 15 and memory 16 constitute a memory block MB. Selector 17 selects a desired data component from among data held or stored in shift register 14, in accordance with a selection signal SEL. The data component thus selected is applied to one input terminal of each digital comparator 18 and 19. The other input terminal of comparator 18 is supplied with an upper-limit set value US of n bits. The other input terminal of comparator 19 is supplied with a lower-limit set value LS of n bits. Comparators 18 and 19, in combination, act as a window comparator which, when the data supplied from selector 17 is larger than the lower-limit set value LS, but smaller than the upper-limit set value US, applies two outputs of H level to an AND gate 20.

A counter 21 counts the clock pulses of a clock CLK3 synchronized with clocks CLK1 and CLK2 and applies a full-count output to AND gate 20. Counter 21 functions to manage the time up to when the data to be sent out through selector 17 is accumulated in shift register 14. Hence, the initial value of counter 21 is set such that the full-count output is sent out when the data components, whose number is compatible with the selection signal SEL, are accumulated. The output terminal of AND gate 20 is connected to a data terminal of flip-flop 22. Shift register 14, selector 17, comparators 18, 19, AND gate 20, and counter 21 constitute a level sequence trigger circuit LST1 which acts as second trigger condition detecting means.

The clock terminal of flip-flop 22 is supplied with a clock CLK4 synchronized with clocks CLK1, CLK2, and CLK3. The output terminal Q of flip-flop 22 is connected to the data terminal of flip-flop 23. The clock terminal of flip-flop 23 is supplied with an output signal from analog comparator 13. The output terminal Q of flip-flop 23 is connected to a trigger control section 24. Trigger control section 24 is adapted to have set therein a trigger mode (for example, a pre-trigger mode, or a post-trigger mode), the length of data being stored in memory 16, etc, using a setting means, not shown. The output signal from trigger control section 24 is applied to memory block MB and to a processor, not shown. The processor applies an address, for read out of the data corresponding to a desired interval, to memory 16. Consequently, the waveform of the input signal corresponding to the desired interval is displayed in a display area (for example of a CRT, not shown).

The operation of the FIG. 3 device will now be described with reference to the timing chart of FIG. 4, which comprises lines (a) through (i).

Figure 4:
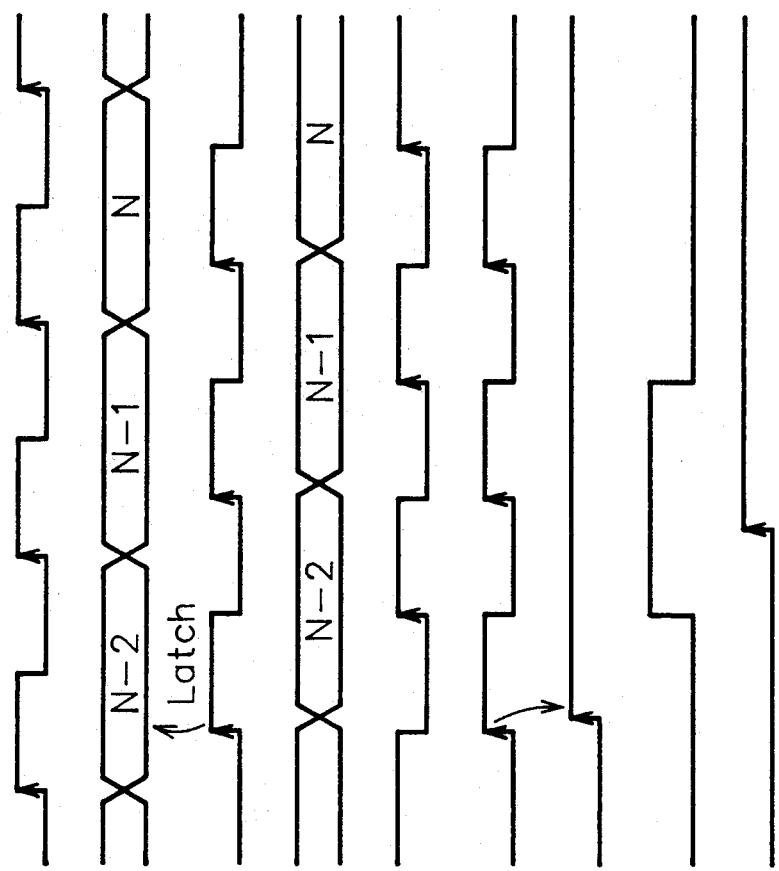
FIG. 4 comprising lines (a) through (i), is a timing chart for explaining the operation of the device of FIG. 3.

Line (a) of FIG. 4 is the sampling clock CLK1 for A/D converter 12. A/D converter 12 performs conversion at the rising edge of clock CLK1, to provide converted output data SD, as shown in line (b).

Line (c) is clock CLK2 of a duty ratio of 50% applied to shift register 14, which is synchronised with clock CLK1. Upon application of clock CLK2, shift register 14 latches the output data from A/D converter 12 and shifts each data component latched therein by one stage.

Line (d) is the data selectively sent out from selector 17. In the example illustrated, the data in the first stage of shift register 14 is sent out. That is, selector 17 applies the data component of one clock past to the one input terminal of each of the comparators 18 and 19.

Line (e) is clock CLK4 applied to flip-flop 22, which has an inverted pulse form of clock CLK2. Flip-flop 22 latches the output of AND gate 20 at the rising edge of clock CLK4.

Line (f) is clock CLK3 applied to counter 21, which is in phase with clock CLK2. Counter 21 adds one to its count at the rising edge of clock CLK2. When the count becomes full, counter 21 applies the output of H level, as shown in Line (g), to AND gate 20. Upon application of the counter output of H level to AND gate 20, the outputs of comparators 18 and 19 become valid thereafter.

Where the data of (l+1) sampling clocks past are to be used as the past data, the initial value of counter 21 should be set such that when l data components are stored in shift register 14 and in memory 16, the count of counter 21 becomes full and counter 21 applies the output signal of H level to AND gate 20. Where data of two past sampling clocks are to be used as the past data, as in the illustrated example, the initial value of counter 21 should be set with l=1.

Line (h) is the output of flip-flop 22. When data applied through selector 17 is larger than the lower-limit set value LS but smaller than the upper-limit set value US, the output signal from comparators 18, 19 become of H level. Since flip-flop 22 latches the output signal of AND gate 20 at the rising edge of clock CLK4, its output becomes of H level only when data of l clocks past lies between the lower-limit set value LS and the upper-limit set value US.

Line (i) is output signal TG of analog comparator 13. When input signal SA becomes larger than the trigger level, output signal TG of analog comparator 13 changes from L level to H level. Flip-flop 23 latches the output of flip-flop 22 to the timing of output signal TG. Trigger control section 24 generates the trigger control signal in compliance with the trigger mode as set.

Figure 5:
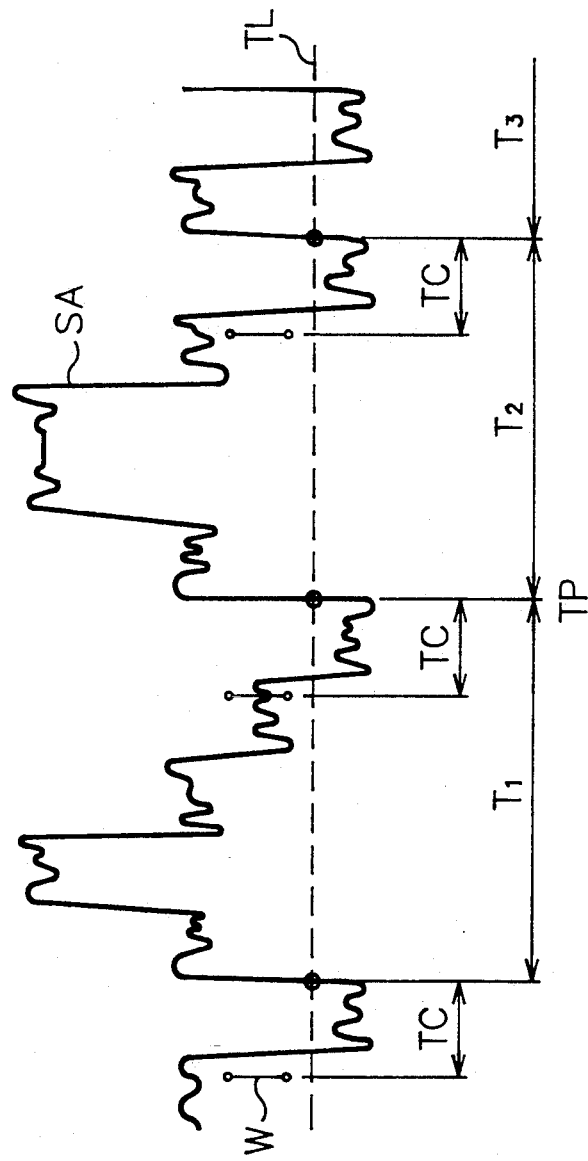
FIG. 5 is a waveform diagram for explaining the operation of the device of FIG. 3.

FIG. 5 is a waveform diagram used to explain the foregoing series of operations, wherein SA is the input signal, TL is the trigger level, W is the window between the lower-limit set value LS and the upper-limit set value US used in comparators 18, 19 during detection, and TC corresponds to n times the period of clock CLK3 being applied to counter 21 (wherein n is an integer inclusive of 1). In the illustrated example, the data in the first stage of shift register 14 is read out through selector 17. Comparators 18, 19 detect this data lying within the window, and only at the moment of TP, when input signal SA crosses the trigger level TL and when the foregoing detection succeeds, the trigger signal is generated.

The storing of input signal data in memory 16 and the reading of the input signal data stored in memory 16 into the processor, are controlled on the basis of the trigger signal, whereby a waveform corresponding to the desired interval alone is displayed.

For example, in case a pre-trigger mode is selected and the set amount for pre-trigger is set at 100%, trigger control section 24 immediately applies the control signal to memory block MB which instructs the device to terminate the storing of data in memory 16. Consequently, among the input signal data stored in memory 16, a portion of the data corresponding to the desired interval is read into the processor at the moment TP, whereby a waveform is displayed.

Further, when the pre-trigger mode is selected and the set amount for pre-trigger is set to 0%, trigger control section 24 applies the control signal to memory block MB which instructs the device to store the data in memory 16. The data length is set by considering the moment TP as the starting point with the maximum length being identical with the length of the memory. Consequently, among the input signal data of a certain set length stored in memory 16 after moment TP, a portion of data corresponding to the desired interval is read into the processor, whereby a waveform is displayed.

On the other hand, in case a post-trigger mode is selected, trigger control section 24 applies the control signal to memory block MB which instructs the device to store the data in memory 16. The data length is set by considering the moment when a certain set delay time elapses after moment TP as the starting point with the maximum length being identical to the length of the memory. Consequently, among the input signal data of certain set length stored in memory 16 after a certain set delay time elapses after moment TP, a portion of data corresponding to the desired interval is read into the processor, whereby a waveform is displayed.

In this way, the invention allows selection of the trigger point TP. This is opposite to the prior art wherein a plurality of waveforms are displayed in superposed form which makes observation difficult. It should be noted that the initial value of counter 21 and the lower-limit set value LS and the upper-limit set value US for comparators 18, 19 can be set as desired depending on the waveform under consideration.

According to the embodiment, the converted output data of A/D converter 12 can be used as data for level sequence triggering because it is processed at the sampling rate of the A/D converter. Thus, it is possible to shorten the time from the time data is sampled by the A/D converter to its becoming usable data for level sequence trigger to, for example, a period of two clocks.

Figure 6:
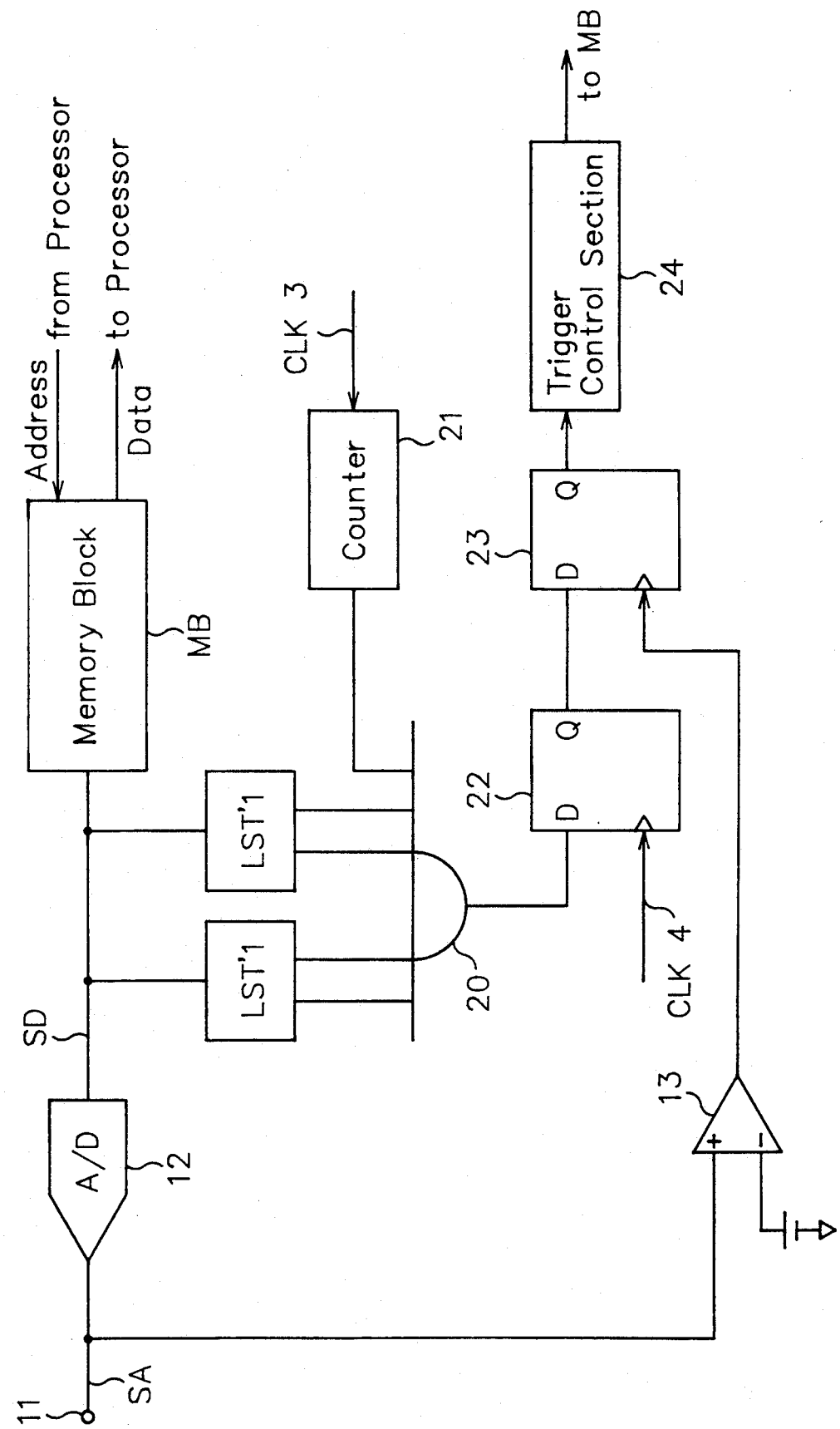
FIG. 6 is a block diagram depicting a modification of the device of FIG. 3.

Although the embodiment of FIG. 3 includes one level sequence trigger circuit LST1, as shown in FIG. 6, a plurality, e.g. two, of LST1 . . . LSTn may be provided, each including a combination of shift register 14, selector 17, and comparators 18, 19, as in the case of LST1. In this case, the outputs of the plurality of level sequence trigger circuits LST1 . . . LSTn are applied to the input terminal of flip-flop 22 after being ANDed or ORed. In this modification, by making the individual combinations of LST's chose data of past moments, it is possible to embody a complex trigger action.

In the embodiment of FIG. 3, the number of stages of shift register 14 should be increased with an increase in the number of data components going backward into the past. This increases the compositional scale of selector 17. The circuit of FIG. 7 improves upon this embodiment.

Figure 7:
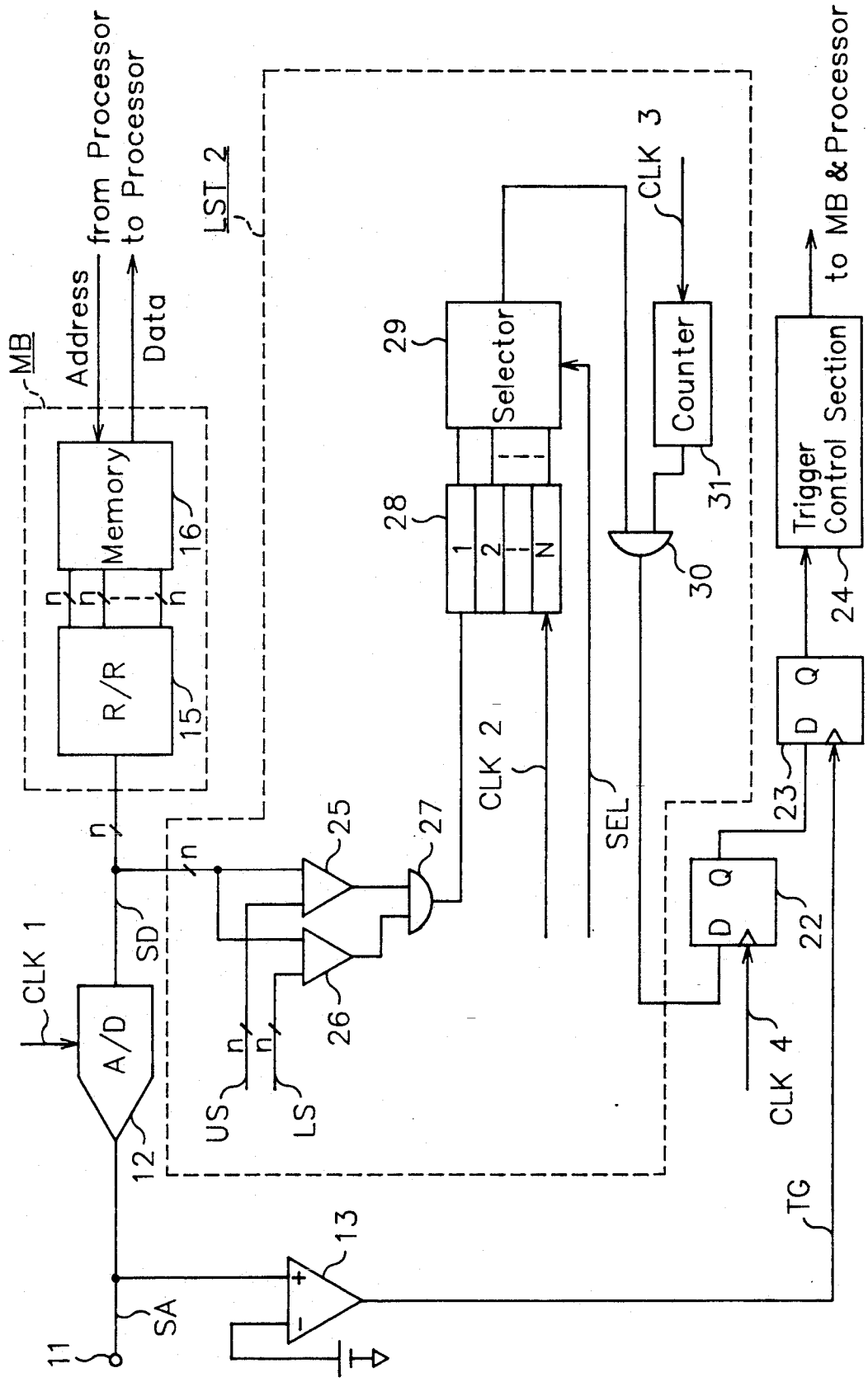
FIG. 7 is a block diagram depicting another illustrative embodiment of the invention.

In FIG. 7, parts which are identical to those of FIG. 3 are designated with the same reference symbols or numerals, and no further description thereof is given hereat for sake of clarity. In FIG. 7, output data SD of A/D converter 12 is applied to memory block MB and to one input terminal of each digital comparator 25, 26 constituting a window comparator. The outputs of comparators 25, 26, after passing through AND gate 27, are successively stored in a shift register 28 of N stages, each having 1 bit, in accordance with clock CLK2 synchronized with clock CLK1. A selector 29 selects a desired data component from among the data stored in shift register 28, in accordance with selection signal SEL, and applies its output to an AND gate 30. A counter 31 counts the clock pulses of clock CLK3 synchronized with clocks CLK1 and CLK2 and when its count becomes full, counter 31 applies its full count output to AND gate 30. Counter 31 functions to manage the time up to when the data to be sent out through selector 29 is accumulated in shift register 28. Hence, the initial value is set such that the full count output is sent out when the data components whose number is compatible with the selection signal SEL are accumulated. The output terminal of AND gate 30 is connected to the data terminal of flip-flop 22. Comparators 25, 26, AND gates 27, 30, shift register 28, selector 29, and counter 31 constitute a level sequence trigger circuit LST2 acting as a second trigger condition detecting means.

Figure 8:
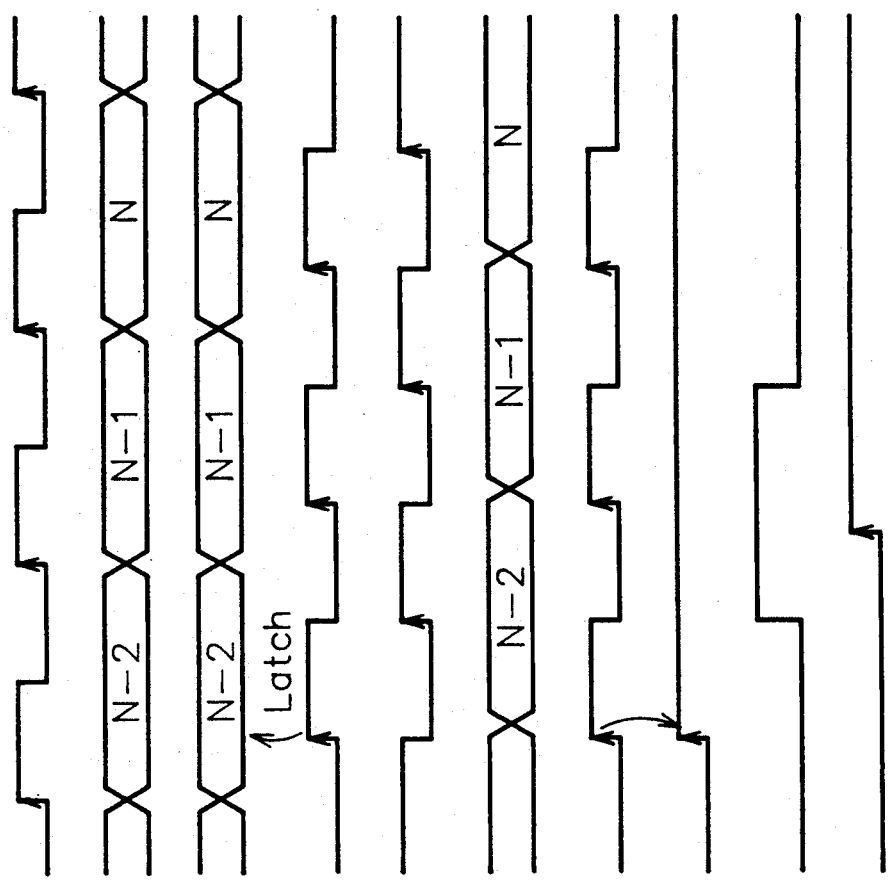
FIG. 8, comprising lines (a) through (j), is a timing chart for explaining the operation of the device of FIG. 7.

The operation of the embodiment will now be described with reference to the timing chart of FIG. 8, which comprises lines (a) through (j). Line (a) of FIG. 8 is sampling clock CLK1 for A/D converter 12. A/D converter 12 provides converted output data SD of n bits as shown in Line (b) at the rising edge of clock CLK1.

Line (c) is the judgment output of 1 bit from the window comparator (comprising comparators 25, 26). Line (d) is clock CLK2 of a duty ratio of 50% applied to shift register 28, which is synchronized with clock CLK1. Upon application of clock CLK2, shift register 28 latches the judgment output data from the window comparator and sifts each data component latched therein by one stage, thereby keeping the N judgment results for the past data.

Line (e) is clock CLK4 applied to flip-flop 22, which as the inverted pulse form of clock CLK2. Flip-flop 22 latches the output of AND gate 30 at the rising edge of clock CLK4. Line (f) is data selectively sent out from selector 29. In the example, data in the first stage of shift register 28 is sent out. That is, the selector 29 applies data of one clock past to AND gate 30.

Line (g) is clock CLK3 applied to counter 31, which is in phase with clock CLK2. Counter 31 adds one to its count at the rising edge of clock CLK2, and when its count becomes full, applies the output of H level, as shown in Line (h), to AND gate 30. Upon application f the counter output of H level to AND gate 30, the output of the selector 29 becomes valid thereafter.

Where data of (l+1) past sampling clocks is used as the past data, the initial value of counter 31 should be set such that when l data components are stored in shift register 28 and in memory 16, the count of counter 31 becomes full and counter 31 applies the output signal of H level to AND gate 30. When the data of two past sampling clocks is used as the past data, as in the example, the initial value of counter 31 should be set to l=1.

Line (i) is the output from flip-flop 22. When output data from A/D converter 12 is larger than the lower-limit set value LS, but smaller than the upper-limit set value US, the output signals from comparators 25, 26 become H level. Since flip-flop 22 latches the output signal of the AND gate 30 at the rising edge of clock CLK4, its output becomes of H level only when data of l clocks past lies between the lower-limit set value LS and upper-limit set value US.

Line (j) is the output signal TG of analog comparator 13. When the input signal SA becomes larger than the trigger level, the output signal TG of analog comparator 13 changes from L level to H level. Flip-flop 23 latches the output of flip-flop 22 at the timing of output signal TG.

Trigger control section 24 generates the control signal on the basis of the rising edge of the output from flip-flop 23.

The foregoing series of operations of the embodiment of FIG. 7 can also be described with reference to the waveform diagram of FIG. 5, wherein W (of FIG. 5) is the window between the lower-limit LS and upper limit US used in comparators 25, 26 during detection and TC corresponds to n times the period of clock CLK3 applied to counter 31 (wherein n is an integer inclusive of 1). In the embodiment of FIG. 7, the trigger signal is generated only when the input signal SA crosses the trigger level TL and when the data in the first stage of shift register 28 being read out through selector 29 indicates that the output data from A/D converter 12 lies within the window of comparators 25, 26.

The subsequent operations are identical with that of FIG. 3; hence, no further description need be given for sake of clarity. As can be appreciated, the invention displays the waveform corresponding to the desired interval alone. Thus, the invention is opposite to the prior art wherein a plurality of waveforms are displayed in superposed form, which makes observation difficult. It should be noted that the initial value of counter 31, the lower-limit value LS and the upper-limit value US for comparators 25, 26 can be set as desired depending on the waveform under consideration.

According to the foregoing embodiment, the converted output data of A/D converter 12 can be used as the data for level sequence triggering because it is processed at the sampling rate of the A/D converter. Thus, advantageously, it is possible to shorten the time from the time data is sampled by the A/D converter 12 to its becoming usable as the data for level sequence triggering to, for example, a period of two clocks. Further, shift register 28 and selector 29 may be made of a 1-bit unit each. In this case, the scale of the circuit can be reduced to 1/n as compared to the device of FIG. 3, wherein the converted output data of n bits of A/D converter 12 is stored directly in shift register 14 and the thusly stored data is then selected by selector 17.

Figure 9:
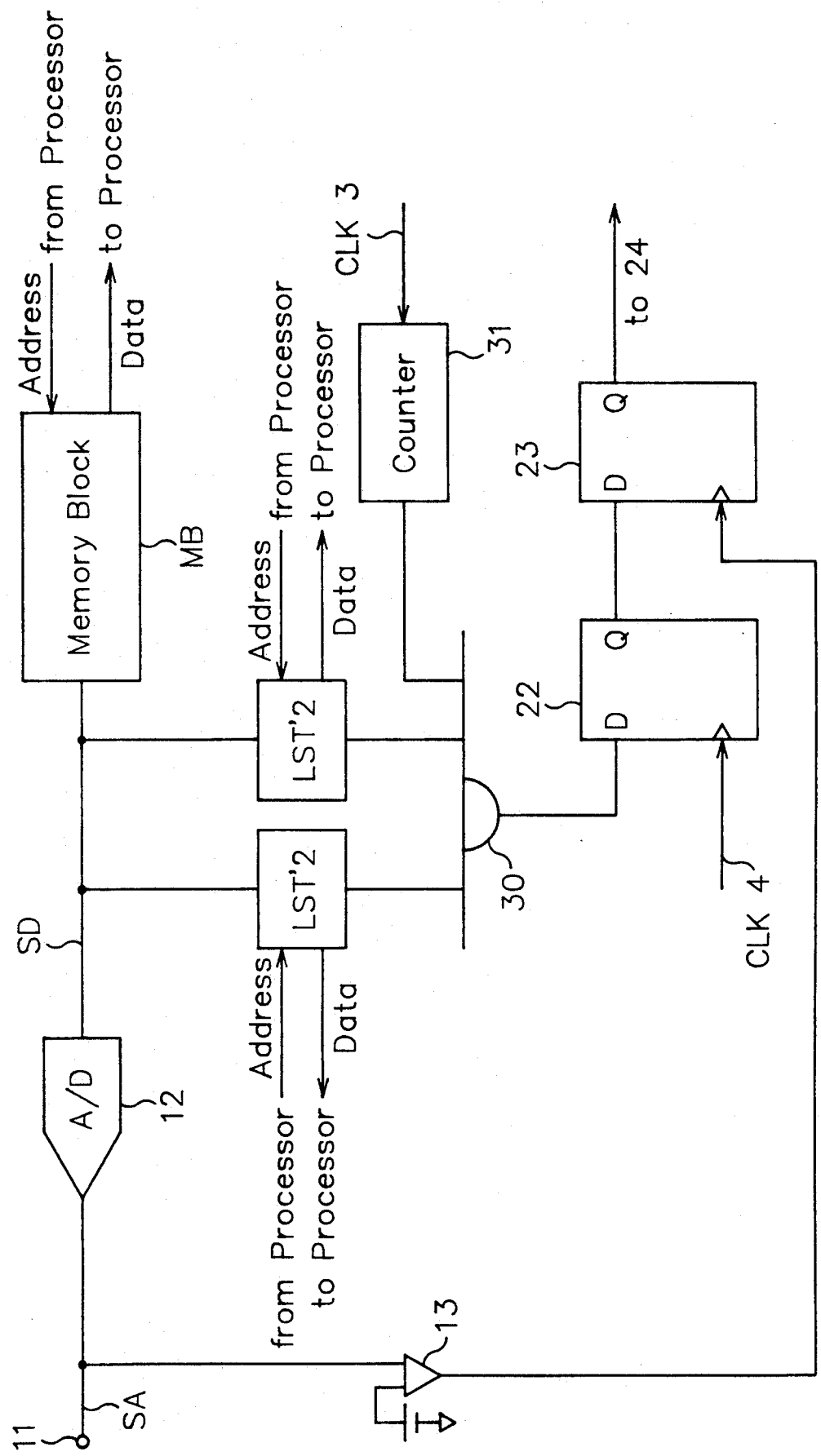
FIG. 9 is a block diagram depicting a modification of the device of FIG. 7.

Although the embodiment of FIG. 7 includes one level sequence trigger circuit LST2, as shown in FIG. 9, a plurality, for example two, of LST2 . . . LSTn may be provided, each including a combination of comparators 25, 26, AND gate 27, shift register 28, and selector 29, as in the case of the level sequence triggering circuit LST2. In this case, the outputs of these circuits LST2 . . . LSTn are applied to the input terminal of flip-flop 22 after being ANDed or ORed. In this modification, by making the individual combinations of LST2 . . . LSTn select data of different past moments, it is possible to embody a complex trigger action.

In the embodiments of FIGS. 3 and 7, the number of stages of shift registers 14, 28 should be increased with increase in the number of data components going back to the past, thereby increasing the compositional scale of selector 17, 29. Where retroaction is desired to be made up to past tens of data components, the circuit scale increase. In such a case, it is preferable to incorporate a level sequence trigger circuit such as shown in FIG. 10 as the second trigger condition detecting means.

Figure 10:
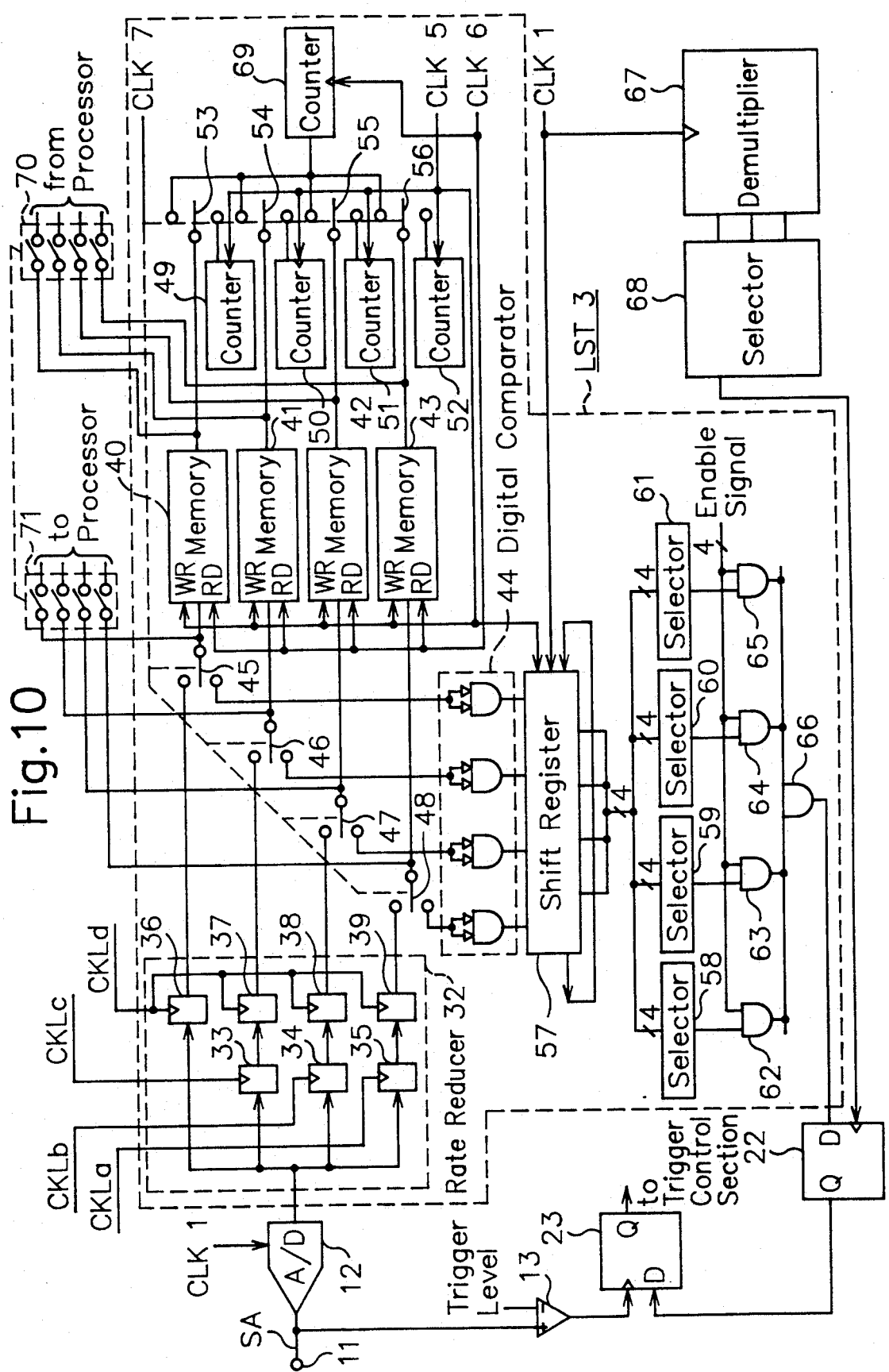
FIG. 10 is a block diagram depicting an electrical circuit used in the embodiments of FIGS. 15 and 16.

According to the circuit of FIG. 10, the output of A/D converter 12 is stored in a plurality of memories in succession to increase the number of judgment points for the past data, whereby a complex judgement can be made, and retroaction can be readily made up to past data components numbering in the tens, with only slight modification.

In FIG. 10, a rate reducer 32 includes seven registers 33 to 39. The output of A/D converter 12 is applied to register 33 to 36, in parallel. The outputs of registers 33 to 35 are applied to corresponding registers 37–39. The registers 33 to 35 are driven by clocks CLKc to CLKa, respectively, whereas registers 36 to 39 are driven by a clock CLKd. Memories 40 to 43 are provided in which data is written at the rising edge of a clock CLK5 and from which data is read out at the rising edge of a clock CLK6. These memories store the outputs of rate reducer Digital comparator 44 includes four window comparators, unnumbered. These window comparators are supplied with data read out from memories 40 to 43 selected by switches 45 to 48, which, when each data lies between the upper-limit set value and lower-limit set value, which may be preset, apply outputs of H level to a shift register 57 in parallel and in synchronization with clock CLK5. The data in shift register 57 is rotated leftward in synchronization with clock CLK1. The contents of shift register 57 are taken out in parallel and applied to selectors 58 to 61. Each of selectors 58 to 61 selects one of the parallel outputs of 4 bits as applied.

The outputs of selectors 58 to 61 are applied to AND gates 62 to 65, and the outputs of these AND gates are in turn applied to an AND gate 66. AND gates 62 to 65 are supplied with an enable signal by which each gate is opened. The output of AND gate 66 is applied to data terminal of flip-flop 22. A frequency demultiplier 67 is supplied with clock CLK1, and provides outputs of frequencies corresponding to ½ and ¼ times the input frequency. A selector 68 selects the outputs from frequency demultiplier 67. The output from selector 68 is applied to the clock terminal of flip-flop 22. The period of clocks CLK5, CLK6 and CLK7 is set to be 4 times that of clock CLK1.

An address for read out of the input signal data corresponding to the desired interval is supplied from the processor, not shown, through a switch 70 to memories 40 to 43. Consequently, the data read out in light of that address is supplied through a switch 71, which is driven in linked relation to switch 70, to the processor, not shown. Although not shown, there may be included a unit which is identical in function to counter 21 of FIG. 3 or counter 31 of FIG. 7, which would inhibit the output of digital comparator 44 until a given number of data components are stored.

The operation of the FIG. 10 circuit will now be described. First, the rate reducer 32 operates as follows.

Figure 11:
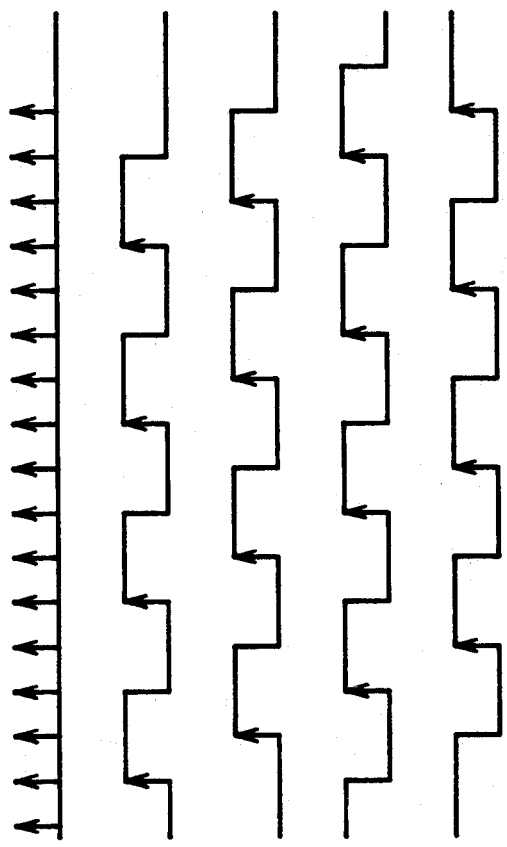
FIGS. 11, 12(A)–12(C), 13(A)–13(C), and 14(A)–14(C), are timing charts for explaining the operation of the circuit of FIG. 10.

FIG. 11 shows the timing of clocks CLK1, CLKa, CLKb, CLKc and CLKd. Clocks CLKa to CLKd have periods which are 4 times that of clock CLK1 and differ in phase from one another by an angle corresponding to ¼ of one period. The output of A/D converter 12 is stored in memories 33 to 35 at the respective rising edges of clocks CLKa to CLKc. The outputs of A/D converter 12 and registers 33 to 35 are stored in registers 36 to 39, respectively, at the rising edge of clock CLKd. Data of registers 36 to 39 are stored in memories 40 to 43, respectively. That is, rate reducer 32 functions to distributively store the output from A/D converter 12 in memories 40 to 43 in succession. With the foregoing provision incorporated into the circuit, each of memories 40 to 43 can be made of a unit having a long cycle time, and trigger action can be carried out on data of several past points, i.e. moments in time.

Second, the overall operation will now be described. The case where data of a past moment backward from and remote from the present time by k clocks (i.e. the k-clock period of the clock CLK2) is referred to as follows. In this case, k is expressed by $$k = 4K + M (0 \leq M < 4) \quad (1)$$

and the count of each of counters 49 to 52 is set to designate an address which corresponds to the address designated by the count of counter 69 minus K or K+1. That is, among counters 49 to 52, the first M counters provide an address corresponding to the current address minus K, and the other counters provide an address corresponding to the current address minus (K+1). Where M=0, all of the counters are set to designate an address corresponding to the current address minus K.

Figure 12:
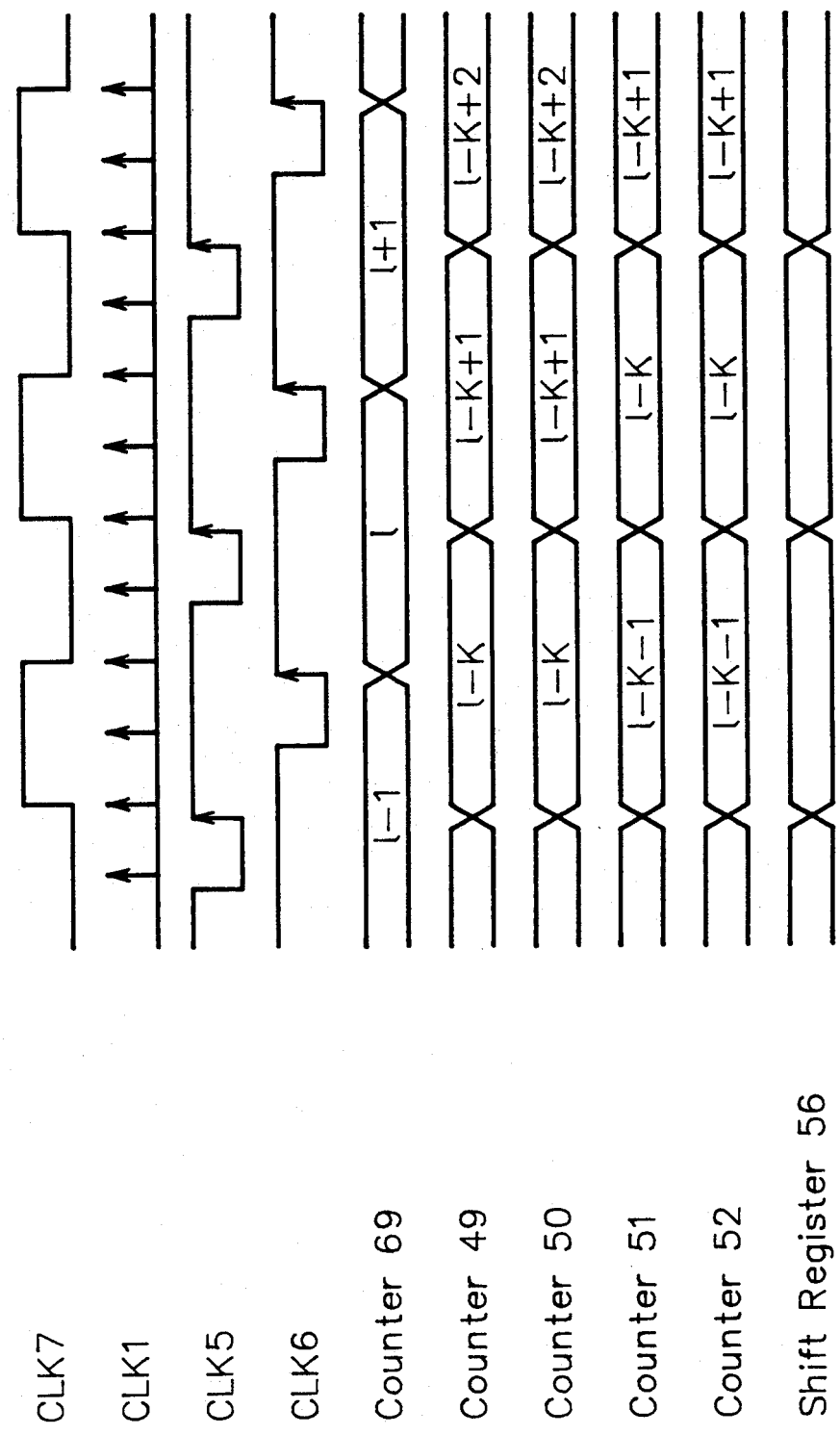
Figure 12:
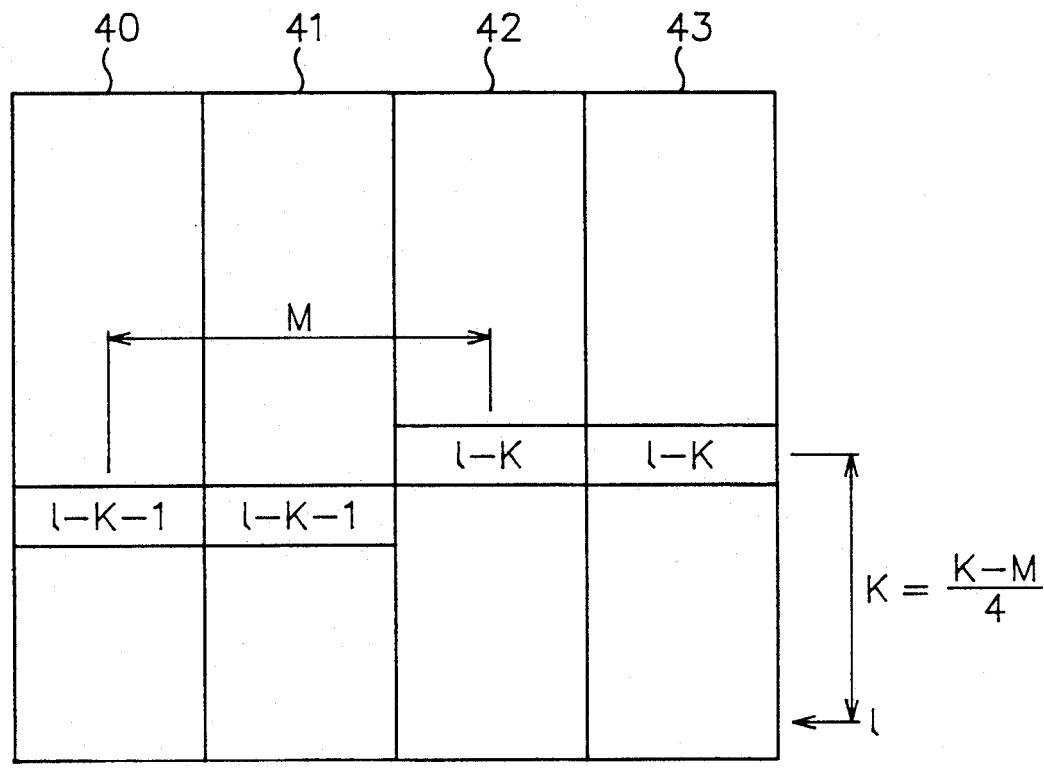
Figure 12:
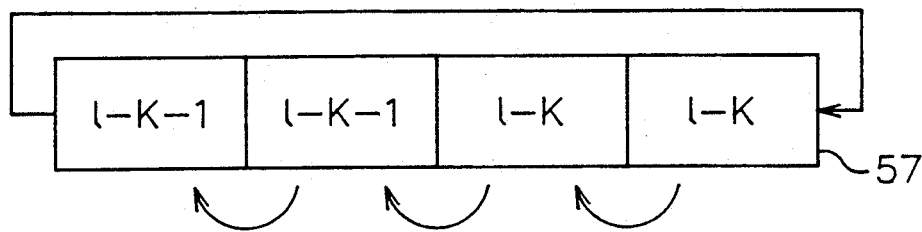

The foregoing algorithm is shown in FIG. 12(A). Let l be the current address, that is, the count of counter 69 is l. Then, counters 49 and 50 hold l−K, and counters 51 and 52 hold l−K−1. Current data is written in memories 40 to 43 at the address designated by counter 69, and data at the addresses designated by counters 49 to 52 are read out, so that the data which is remote and backward by k to (k−3) clocks from the present moment are supplied to digital comparator 44.

The foregoing condition is shown in FIG. 12(B). l is the address at which current data is written. Read out is performed at the address which is remote and backward in time by K (as expressed in equation (1)) or (K+1) from the address l. Because M=2, memories 40 and 41 are set at l−K−1, whereas memories 42 and 43 are set at l−K. Data at these locations as addressed are compared in digital comparator 44 with a certain range which is preset. The results are supplied to shift register 57 in four-bit parallel and in synchronization with the rising edge of clock CLK5.

This is shown in FIG. 12(C). The shift register 57 holds from the left data at the addresses "l−K−1" and "l−K" of memories 40 to 43. The contents of the shift register are rotated leftward, as shown by the arrows, in response to clock CLK1. Consequently, the judgment result obtained through 4-bit parallel processing is converted to serial form. The judgment result is then applied to selectors 58 to 61. Since the setting is such that only selector 58 or AND gate 62 (by the enable signal) is selected, the judgment result is passed through selector 58 and AND gates 62 and 66 and applied to the data terminal D of flip-flop 22. Selector 68 selects the 1/1 output (i.e. not demultiplied) from frequency demultiplier 67, which is applied to the clock terminal of flip-flop 22.

The subsequent operation is identical with that of the device of FIG. 3 or FIG. 7. Hence, no further description is given hereat for sake of clarity. Although the circuit of FIG. 10 has been described such that only selector 68 is selected, thereby referring to one past data component alone, it is possible to refer to successive one to four past points by properly selecting selectors 58 to 61.

Figure 13:
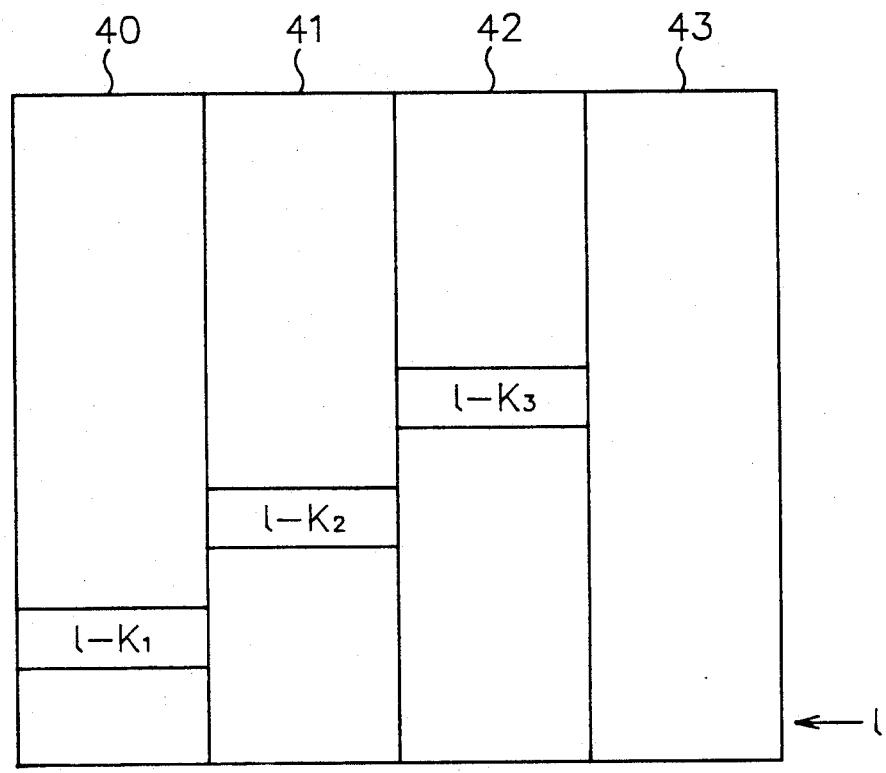
Figure 13:
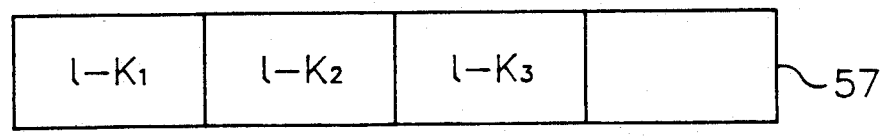

The case where a plurality of scattered points are to be referred to in terms of past levels will now be described with reference to FIGS. 13(A)–13(C). In these figures, the numbers contained in the timing charts represent the respective counts of counter 69, and counters 49 to 52. The timing of clocks CLK7, CLK1, CLK5 and CLK6 is omitted from these figures because it is identical to that shown in FIGS. 12(A)–(C). Let the points under reference be three past clock points $k_1$, $k_2$, $k_3$ on clock CLK1. The setting is made as shown in FIG. 13(B) such that the addresses designated by counters 49 to 52 are remote and backward in time from the address designated by counters 69 by $K_1$ to $K_3$, respectively, as shown by the below equations.

$$K_1 = \text{int}(k_1/4)$$

$$K_2 = \text{int}(k_2/4)$$

$$K_3 = \text{int}(k_3/4) \quad (2)$$

In equation (2), "int( )" represents that the left side of the equation takes an integral part of a parenthesized portion. No counter is used. Thus, the past data designated by counters 49 to 51 are supplied to digital comparator 44. Digital comparator 44 makes a judgment as to whether each data component lies within a certain past present range, and the judgment result is applied through shift register 57 to selectors 58 to 61, as shown in FIG. 13(C).

In this case, shift register 57 performs no shifting of the data, but is used merely as a buffer. Among selectors 58 to 61, selectors 58 to 60 are selected. AND gate 66 makes a judgment as to whether all past data designated by counters 49 to 51 are within a given range. The judgment result is supplied to data terminal D of flip-flop 22. In the example, since the data applied to digital comparator 44 is renewed at a period corresponding to 4 times that of clock CLK1, selector 68 applies a clock, which is derived by frequency-demultiplying clock CLK2 by a factor of ¼ in frequency demultiplier 67, to the clock terminal of flip-flop 22. As a result, the time from the present to past points to be referred to, involves uncertainty as much as 4 times the period of clock CLK1.

Figure 14A:
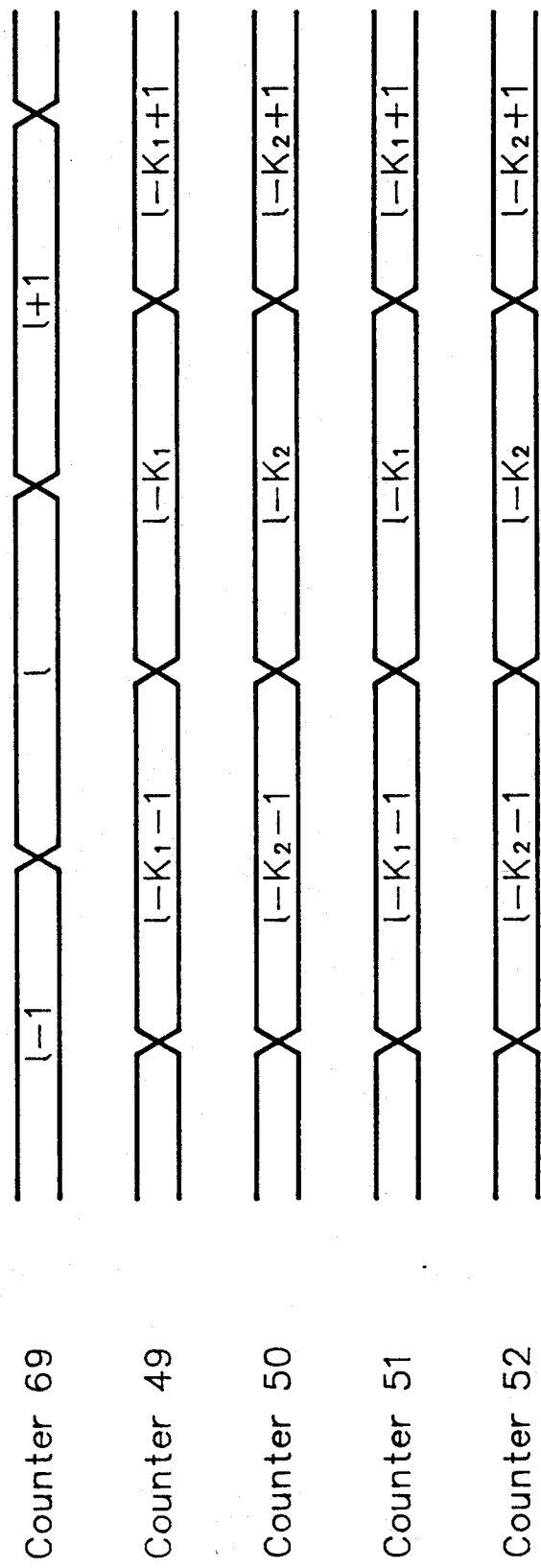
Figure 14:
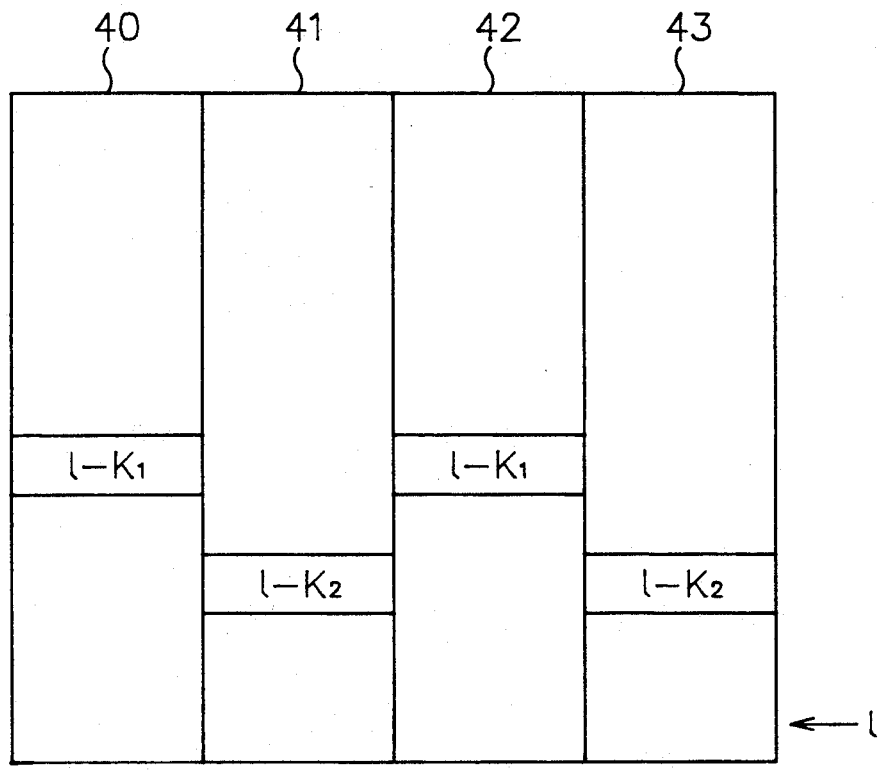
Figure 14:
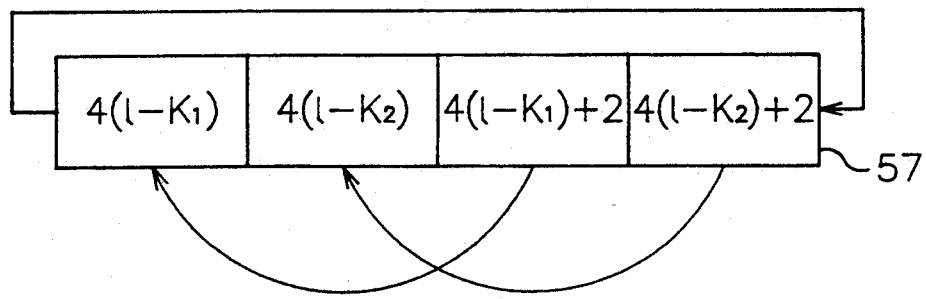

The case where two past points are referred to will now be described with reference to FIGS. 14(A)–14(C). Let the past points be referred to be clocks $k_1$ and $k_2$, and the values by which the address is to be postponed be $K_1$ and $K_2$ as expressed by equation (2). Then, the setting is made such that counters 49 and 51 provide an address postponed by $K_1$ and counters 50 and 52 provide another address postponed by $K_2$. That is, values $K_1$ and $K_2$ are set alternately. This condition is shown in FIG. 14(B).

Consequently, as shown in FIG. 14(C), the results of judgment from digital comparator 44 are stored in shift register 57 such that each result arranged from the left has a delay of $4(1-K_1)$, $4(1-K_2)$, $4(1-K_1)+2$ and $4(1-K_2)+2$ clocks, respectively, where the time base of these delays is the period of clock CLK2. The contents of shift register 57 are shifted leftward on a two-clock basis in response to clock CLK1 as illustrated by the arrows. Trigger action is carried out on data of past two points by applying a clock which is derived by frequency-demultiplying the clock CLK1 by a factor of ½, to the clock eterminal of flip-flop 22. It should be noted that the circuit of FIG. 10 involves uncertainty as much as two times the period of clock CLK1, depending on the values set in counters 49 to 52. Although the rate reducer 32 of FIG. 10 applies the input signal to four memories 40 to 43 in succession, by the rate reducer 32 distributing the input signal to a larger number of memories, it is possible to arbitrarily change the number of past points to be referred to.

In the circuit of FIG. 10, the convered output data of A/D converter 12, after its rate is reduced by rate reducer 32, is written in the memories, and the data stored in the memories are read out into comparator 44. Then, the flip-flops are set. The foregoing operation is controlled on the basis of the operational cycle of rate reducer 32. However, data, after being transferred to shift eregister 57, is set in the flip-flop for trigger generation on the basis of the original clock rate. That is, there are 8 clocks between the time when the data is sampled and the time when the level sequence trigger circuit is set. Thus, data of up to 9 clocks past are utilizable. However, without increasing the scale of the circuit, it is possible, depending on the setting of counters 49 to 52, to read out data of past points older than that attained by use of the circuit of FIG. 3 or FIG. 7 for the purpose of triggering.

Figure 15:
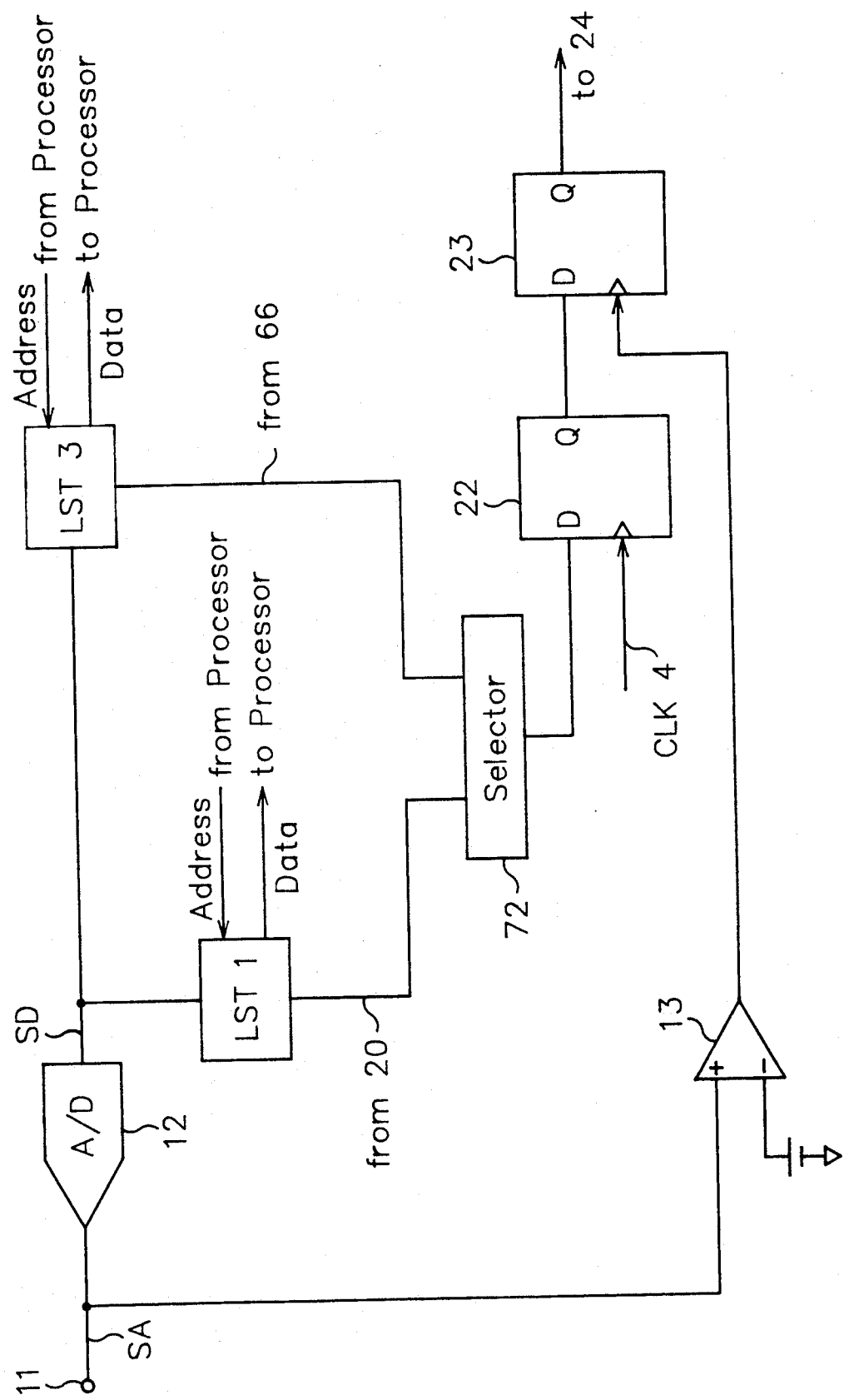
FIGS. 15 and 16 are block diagrams depicting further illustrative embodiments of the invention.

For example, the second trigger condition detecting means may be formed as shown in FIG. 15 by combining the LST1 of FIG. 3 and the LST3 of FIG. 10. In FIG. 15, output data from AND gate 20 of LST1 and output data from AND gate 66 of LST3 are supplied to a selector 72. When data of m or more clocks past are utilized, output data from LST3 is passed to flip-flop 22, or when data of 2 to (m−1) clocks past are utilized, output data from LST1 is passed to flip-flop 22.

Figure 16:
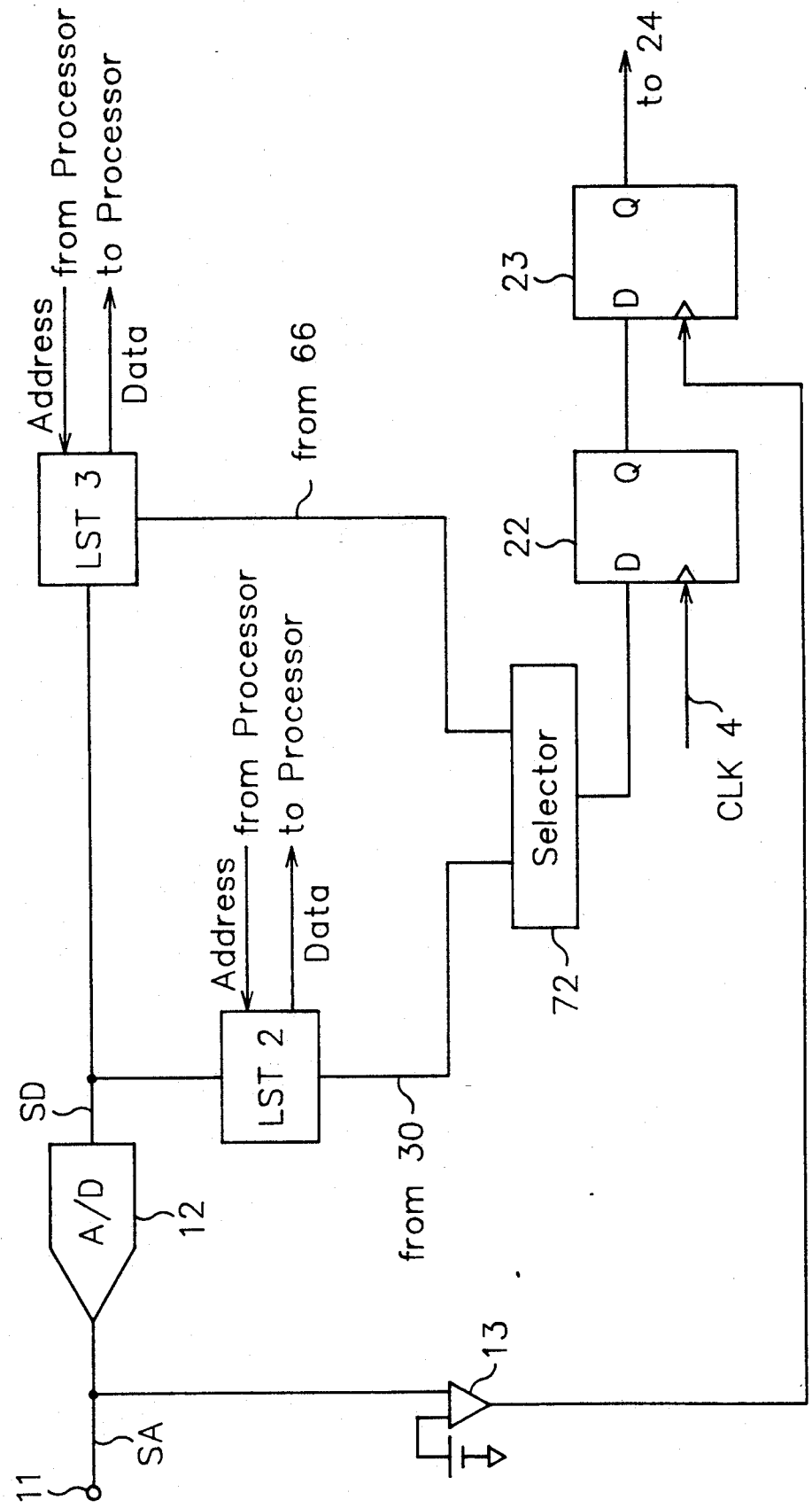

Further, the second trigger condition detecting means may be formed as shown in FIG. 16 by combining LST2 of FIG. 7 and LST3 of FIG. 10. In FIG. 16, output data from AND gate 30 of LST2 and output data from AND gate 66 of LST3 are supplied to selector 72. When data of m or more clocks past are utilized, the output data from LST3 is passed to flip-flop 22, or when data of 2 to (m−1) clocks past are utilized, output data from LST2 is passed to flip-flop 22.

As described above, any desired data can be utilized over a wide range of past points without increasing the scale of the circuit.

Further, the first trigger condition detecting means may be made of a digital comparator. In this case, analog comparator 13 is replaced with a digital comparator by which a judgment is made as to whether the digital output signal of A/D converter 12 meets the first trigger condition.

Further, AND gate 66 of FIG. 10 may be replaced with an OR gate. In this case, a display is presented when triggering is caused at any point under reference.

Moreover, a waveform display section may be modified such that it displays, together with a waveform, the range of limit set values, for example, as set in digital comparator 44, and the range of uncertainty relating to past points under reference. This facilitates the handling of the device. In this case, setting operation becomes easier if a waveform is displayed without any setting. Then, the range of triggering for some past points under reference is set while observing the waveform being displayed.

As described above, the invention provides a waveform measuring device which is capable of displaying any irregular waveform without superpositioning of waveforms, as done in the prior art.

The device according to the invention allows displaying of a portion of a waveform, including an exceptional event of phenomenon, by suitably setting some past point under reference and the range of displaying. Thus, advantageously, the invention provides processing of low-rate, high-speed equivalent temporal sampling.

The foregoing description is illustrative of the principles of the invention. Numerous extensions and modifications thereof would be apparent to the worker skilled in the art. All such modifications and extensions are to be considered to be within the spirit and scope of the invention.

What is claimed is:

1. A waveform measuring device comprising
an A/D converter for converting an analog input signal into a digital output signal;
memory means for storing the digital output signal from said A/D converter;
first detecting means for operating on the analog input signal and for generating a present signal;
second detecting means for operating on the digital output signal from said A/D converter and for detecting among said digital output signal a first signal of a desired time remote from the present time, said second detecting means comprising
a first block including
first comparator means for detecting output data from said A/D convert which is within a preset range of values,
shift register means for successively storing output data from said first comparator means, and
first selector means for selecting a desired data component from among data stored in said shift register means;
a second block including
second comparator means for reading past data of a desired time remote from the present time out of said memory means and for detecting past data which is within a present range of values, and
second selector means for selecting either output from said first block or output from said second block and for transmitting the selected output as the first signal;
trigger signal means for generating a trigger signal in response to said present signal and to said first signal; and
means responsive to said trigger signal and operating on the digital output signal stored in said memory means, for displaying in real time a waveform of said analog input signal corresponding to a desired interval of time,
so that data in the digital output signal is utilized for waveform display control independent of the time required to store and read out the digital output signal in said memory means.

2. The device of claim 1, wherein said first detecting means comprises an analog comparator for receiving said analog input signal.

3. The device of claim 1, wherein said second detecting means further comprises a digital comparator for processing the digital output signal from said A/D converter.

4. The device of claim 1, wherein further comprising a rate reducer; and wherein the output data from said A/D converter is stored in said memory means after being distributed by said rate reducer to a plurality of routes.

* * * * *